United States Patent [19]
Kholodenko et al.

[11] Patent Number: 6,015,465
[45] Date of Patent: Jan. 18, 2000

[54] TEMPERATURE CONTROL SYSTEM FOR SEMICONDUCTOR PROCESS CHAMBER

[75] Inventors: Arnold Kholodenko, San Francisco; Ke Ling Lee, Cupertino; Maya Shendon, San Carlos; Efrain Quiles, San Lorenzo, all of Calif.

[73] Assignee: Applied Materials, Inc., Santa Clara, Calif.

[21] Appl. No.: 09/057,097

[22] Filed: Apr. 8, 1998

[51] Int. Cl.[7] .............................. B05C 11/00; C23C 16/00
[52] U.S. Cl. .......................... 118/719; 118/712; 118/715
[58] Field of Search ................................... 118/712, 715, 118/723 I, 723 IR, 723 AN, 663, 666, 692, 64, 719 E; 156/345 MT, 345 P, 345 C; 204/298.25, 298.35

[56] References Cited

U.S. PATENT DOCUMENTS

| | | | |
|---|---|---|---|
| 4,477,711 | 10/1984 | Mihara et al. | 219/121 PJ |
| 4,806,321 | 2/1989 | Nishizawa et al. | 422/245 |
| 5,131,233 | 7/1992 | Cray et al. | 62/64 |
| 5,143,552 | 9/1992 | Moriyama | 118/666 |
| 5,155,331 | 10/1992 | Horiuchi et al. | 219/121.43 |
| 5,160,545 | 11/1992 | Maloney et al. | 118/725 |
| 5,220,804 | 6/1993 | Tilton et al. | 62/64 |
| 5,247,152 | 9/1993 | Blankenship | 219/121.49 |
| 5,254,171 | 10/1993 | Hayakawa et al. | 118/723 MR |
| 5,342,471 | 8/1994 | Fukasawa et al. | 156/345 |
| 5,508,884 | 4/1996 | Brunet et al. | 361/698 |
| 5,569,361 | 10/1996 | Hurwitt | 204/192.12 |
| 5,685,912 | 11/1997 | Nishizaka | 118/719 |
| 5,772,771 | 6/1998 | Li et al. | 118/723 I |
| 5,824,158 | 10/1998 | Takeuchi et al. | 118/723 IR |
| 5,882,410 | 3/1999 | Kawahara et al. | 118/712 |
| 5,900,062 | 5/1999 | Loewenhardt et al. | 118/723 R |

FOREIGN PATENT DOCUMENTS

0276061  1/1988  European Pat. Off. .

*Primary Examiner*—Bruce Breneman
*Assistant Examiner*—Paul J. Lee
*Attorney, Agent, or Firm*—Janah And Associates

[57] ABSTRACT

A temperature control system 10 is used to control the temperature of a chamber surface 15, such as a convoluted external surface, of a process chamber 25 that is used to process a semiconductor substrate 30. The temperature control system 10 comprises a vapor chamber 100 that forms an enclosure adjoining or surrounding the process chamber surface 15. A fluid distributor 115 in the vapor chamber 100 applies a fluid film 130 onto the process chamber surface 15. Vaporization of the fluid film 130 from the chamber surface 15 controls the temperature of the chamber surface. Optionally, a vent 165 in the vapor chamber 100 can be used to adjust the vaporization temperature of the fluid in the vapor chamber.

13 Claims, 9 Drawing Sheets

TEMPERATURE CONTROL SYSTEM FOR SEMICONDUCTOR PROCESS CHAMBER

BACKGROUND

The present invention relates to a temperature control system for semiconductor process chambers.

Temperature control systems are used to monitor and control the temperature of semiconductor process chambers which are used to deposit or etch dielectric and conducting material on semiconductor substrates. The deposition, and etching processes are often highly temperature dependent. For example, in etching processes, the shape of the etched features can widely vary as a function of the temperature profile across the substrate surface which in turn is dependent on the temperature of the chamber surfaces. Also, an etchant byproduct residue layer that forms on walls of the chamber, can flake off and contaminate the substrate when subjected to large thermal stresses arising from temperature variations of the chamber surfaces. Another temperature control problem occurs for chamber walls composed of ceramics such as silicon, $B_4C$ or BN, which have a relatively low thermal shock resistance and can crack when subjected to high thermal stresses. Also, chamber walls composed of ceramic and metals which have widely varying thermal expansion coefficients can break apart when subjected to different temperatures. Thus, it is desirable to control the temperature of the chamber surfaces and reduce temperature fluctuations from one process cycle to another.

Conventional temperature control systems for semiconductor process chambers include "water-jacket" liquid recirculating systems, radiant heating systems, forced-air cooling systems, or combinations thereof. However, in typical chambers, the arrangement of components such as inductor coils adjacent to the walls of the chamber make it difficult to control the temperature of the chamber surfaces because it is difficult to provide uniform heat transfer rates between the complex shaped features of the inductor coil. Furthermore, conventional water-jacket systems recirculate water through a large number of cooling channels that form a bulky shape surrounding the chamber. Also, the cooling channels absorb RF induction energy and cannot be used in plasma chambers where RF energy has to be coupled to the chamber through spaces in the cooling system. Furthermore, improper positioning of the cooling channels around the components of the chamber can cause localized hot spots and resultant process instabilities. It is also difficult to obtain uniform heat transfer rates across a chamber surface using the cooling channels because they are hard to attach onto convoluted surfaces and form localized thermal resistances at their interfaces.

Forced air cooling systems, as described in U.S. Pat. No. 5,160,545, issued Nov. 3, 1992, use fans to blow air through a heat exchanger and across the chamber surfaces. The forced air systems interfere less with operation of chamber components, such as inductor coils, than water jacket liquid recirculating systems. However, portions of the chamber surface that are shielded by the chamber components result in localized hot spots. Also, because the primary mode of heat transfer is conduction by air, forced air systems typically require extremely large air flow rates to achieve a moderately acceptable response time to temperature fluctuations caused by turning on and off the plasma or other such heat loads. Large air flow rates are only provided by large sized fans which are prone to mechanical failure, and upon failure, can severely damage chamber components and brittle ceramic surfaces.

Thus, it is desirable to have a temperature control system that is capable of providing uniform temperatures across a surface of a process chamber and that can rapidly compensate for temperature fluctuations of the chamber surface. It is further desirable for the temperature control system to provide constant temperatures for widely varying heat loads inside the chamber. It is also desirable to have a temperature control system that does not interfere with the operation of high voltage electrical components, and in particular, does not attenuate the inductive coupling of RF energy coupled through the chamber walls. It is further desirable for the temperature control system to reduce thermal and mechanical stresses on the chamber surfaces.

SUMMARY

The present invention relates to a temperature control system for controlling the temperature of a surface of a semiconductor process chamber. The temperature control system comprises a vapor chamber that forms an enclosure adjoining the chamber surface. A fluid distributor in the vapor chamber applies a substantially continuous fluid film over the chamber surface that vaporizes to form a vapor in the vapor chamber to control the temperature of the chamber surface. Preferably, the fluid distributor comprises one or more sprayer nozzles, or a slit nozzle for spraying or applying a stream of fluid on the external surface. The temperature of the chamber surface is controlled through vaporization of the fluid film to form vapor in the vapor chamber.

The temperature control system is particularly useful for controlling the temperature of a semiconductor processing apparatus comprising a process chamber having an external surface. A typical process chamber comprises a support for holding the substrate in the chamber, a gas distributor for distributing process gas in the chamber, a plasma generator for forming a plasma from the process gas, and an exhaust for exhausting spent process gas from the chamber. Preferably, the temperature control system includes a vapor chamber surrounding the external surface of the process chamber and a fluid distributor for applying a fluid film over the external surface of the process chamber to control its temperature. In one embodiment, the apparatus is a plasma processing apparatus having an inductor antenna abutting a dielectric wall for generating a RF induction field for forming an induction plasma in the process chamber. The vapor chamber adjoins the dielectric wall and comprises a fluid distributor for applying fluid on the dielectric wall, to form a fluid film. The fluid has a RF field absorption sufficiently low to allow permeation of the RF induction field through the fluid film and into the chamber.

The present invention also encompasses a method of controlling the temperature of a surface of a semiconductor process chamber. In the method, fluid is dispersed on the chamber surface so that the fluid vaporizes to form a vapor. At least a portion of the vapor is contained in a vapor zone surrounding the chamber surface. More preferably, the method further comprises the steps of measuring the vapor pressure of the vapor in the vapor zone and adjusting the temperature of the fluid applied to the chamber surface in relation to the measured vapor pressure.

In another aspect the invention is directed to a computer program product for regulating the temperature of a chamber surface. The computer program product comprises a computer usable medium having computer readable program code means embodied in the medium. The computer program code includes temperature regulator program code for operating a temperature regulator to regulate the temperature of a fluid, fluid distribution program code for controlling the flow rate of fluid applied by a fluid distributor over the chamber surface, and pressure sensing program code for sensing a vapor pressure of vapor in a vapor chamber surrounding the chamber surface, and providing a pressure signal to the temperature regulator for adjusting the temperature of the fluid in relation to the pressure signal.

DRAWINGS

These and other features, aspects, and advantages of the present invention will be better understood from the following drawings, description and appended claims, all of which are provided to illustrate examples of the invention, where:

FIG. 5b is a schematic sectional top view of the flat heater of FIG. 5a;

DESCRIPTION

The temperature control system according to the present invention is capable of maintaining uniform and constant temperatures across a surface of a semiconductor process chamber for changing thermal loads and temperature fluctuations inside the process chamber. The temperature control system is particularly advantageous for controlling the temperature of a convoluted external surface of a process chamber that has a complex three-dimensional relief structure. For example, the invention can be used to control the temperature of a wall or ceiling of a semiconductor process apparatus that has adjacent components, such as inductor coils, gas flow meters, or process gas distributors. The temperature control system of the present invention maintains a constant and uniform temperature across the chamber surface, reduces the mechanical and thermal stresses on the chamber surface, and provides consistent substrate processing rates.

Figure 1:
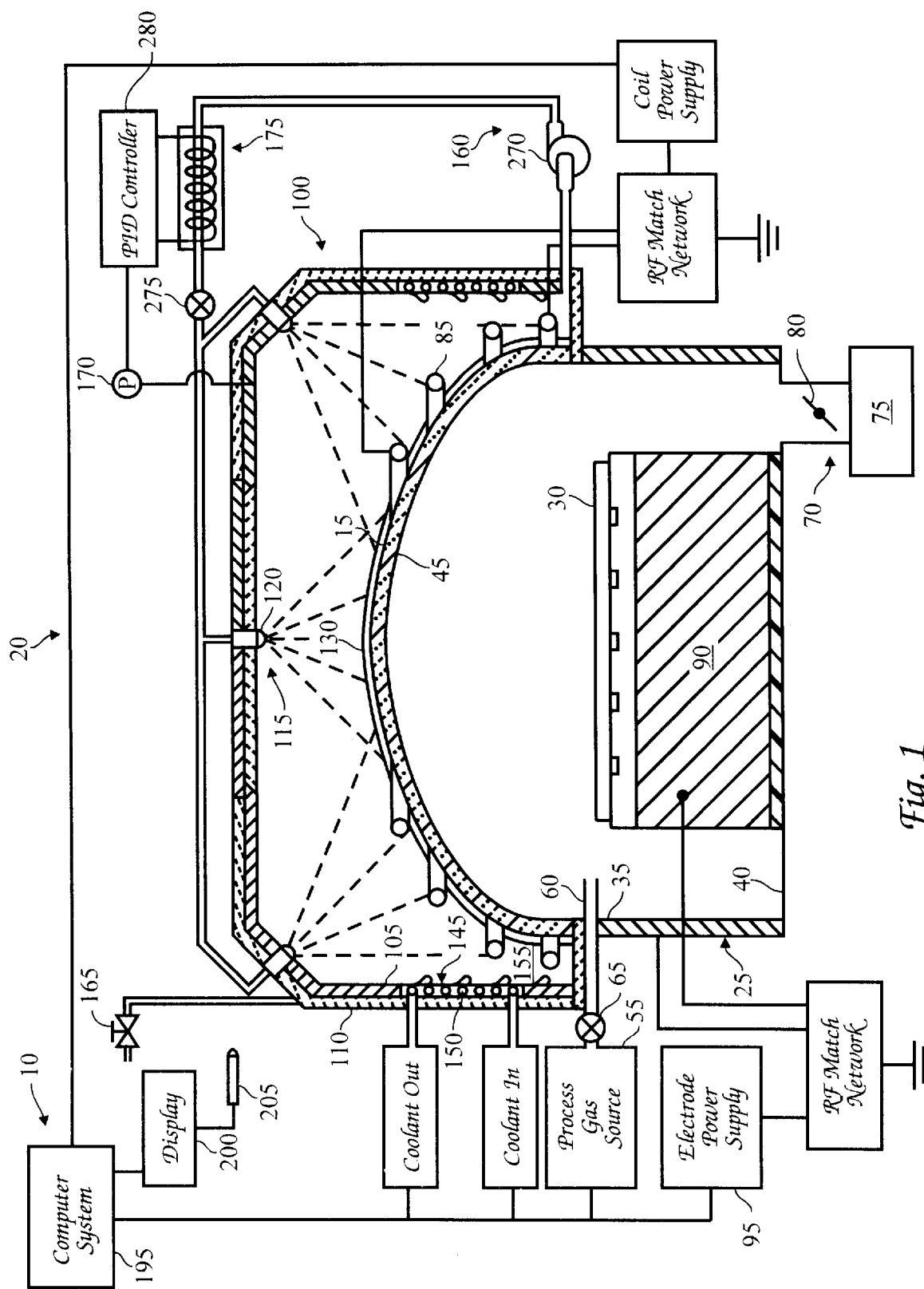
FIG. 1 is a schematic sectional side view of a semiconductor process chamber having a temperature control system according to the present invention.

An exemplary temperature control system 10 used for controlling a temperature of an external chamber surface 15 of a semiconductor processing apparatus 20 comprising a process chamber 25 is shown in FIG. 1. The particular embodiment of the apparatus 20 (commercially available from Applied Materials Inc., Santa Clara, Calif.) is suitable for plasma etching of semiconductor substrates 30, is provided only to illustrate the invention, and should not be used to limit the scope of the invention. For example, the present invention can also be used for non-plasma process chambers, physical vapor deposition chambers, and chemical vapor deposition chambers.

Particular features of the process chamber 25 illustrated in FIG. 1 are described in U.S. patent application Ser. No. 08/597,445, entitled "RF Plasma Reactor with Hybrid Conductor and Multi-Radius Dome Ceiling" filed on Feb. 2, 1996; and in U.S. patent application Ser. No. 08/389,889, filed on Feb. 15, 1993—both of which are incorporated herein by reference. Generally, the process chamber 25 comprises an enclosure having sidewalls 35, a bottom wall 40, and a ceiling 45, that is fabricated from a variety of materials including metals, ceramics, and polymers. Process gas is introduced into the process chamber 25 through a gas distribution system that comprises a process gas supply 55, a process gas distributor 60, and a gas flow controller 65. An exhaust system 70 comprising one or more exhaust pumps 75 (typically including a 1000 liter/sec roughing pump) and throttle valves 80 is used to exhaust spent process gas and to control the pressure of the process in the process chamber 25. Preferably, an asymmetric pumping channel surrounding the substrate 30 receives spent process gas to exhaust the gas out of the process chamber 25.

The apparatus 20 further comprises an inductor antenna 85 adjacent to the process chamber 25 to generate an inductive field that inductively couples RF power to the process gas in the process chamber for forming a plasma. The inductor antenna 85 preferably comprises multiple coils positioned adjacent to the process chamber ceiling 45. In addition to the inductor antenna 85, the ceiling 45 and a substrate support 90 can serve as process electrodes that, when electrically biased relative to one another, capacitively couple to energize the plasma. An electrode voltage supply 95 maintains the process electrodes at different electrical potentials to provide highly directional plasma ions in the process chamber 25.

The ceiling 45 of the process chamber 25 forms a complex shaped surface whose temperature is regulated by the temperature control system 10. The ceiling 45 can be flat or rectangular shaped, arcuate, conical, or dome-shaped, and in one version comprises a multi-radius dome-shape above the substrate 30 that provides a uniform distribution of plasma induction source power across the entire volume of a plasma zone defined by the ceiling, to increase dissociation of process gas in the plasma zone. The ceiling 45 can be made from a dielectric ceramic material, such as quartz or aluminum oxide, that provides low impedance to an RF induction field transmitted by the inductor antenna 85 above the ceiling 45, allowing the RF induction field generated by the inductor antenna to permeate through the ceiling. Alternatively, the ceiling 45 can be made from semiconducting material such as silicon, that serves as an induction field transmitting window, yet is sufficiently electrically conductive to also serve as a process electrode.

The temperature control system 10 comprises an enclosure or vapor chamber 100 that adjoins or surrounds at least a portion of the chamber surface 15. The vapor chamber 100 provides a gas tight barrier for controlling the partial and absolute pressure of vapor and/or gas contained in the vapor chamber. Preferably, the vapor chamber 100 comprises an inner metal wall 105 at least partially enclosed by an outer thermal insulator layer 110 to steady state temperatures in the vapor chamber 100.

Figure 2:
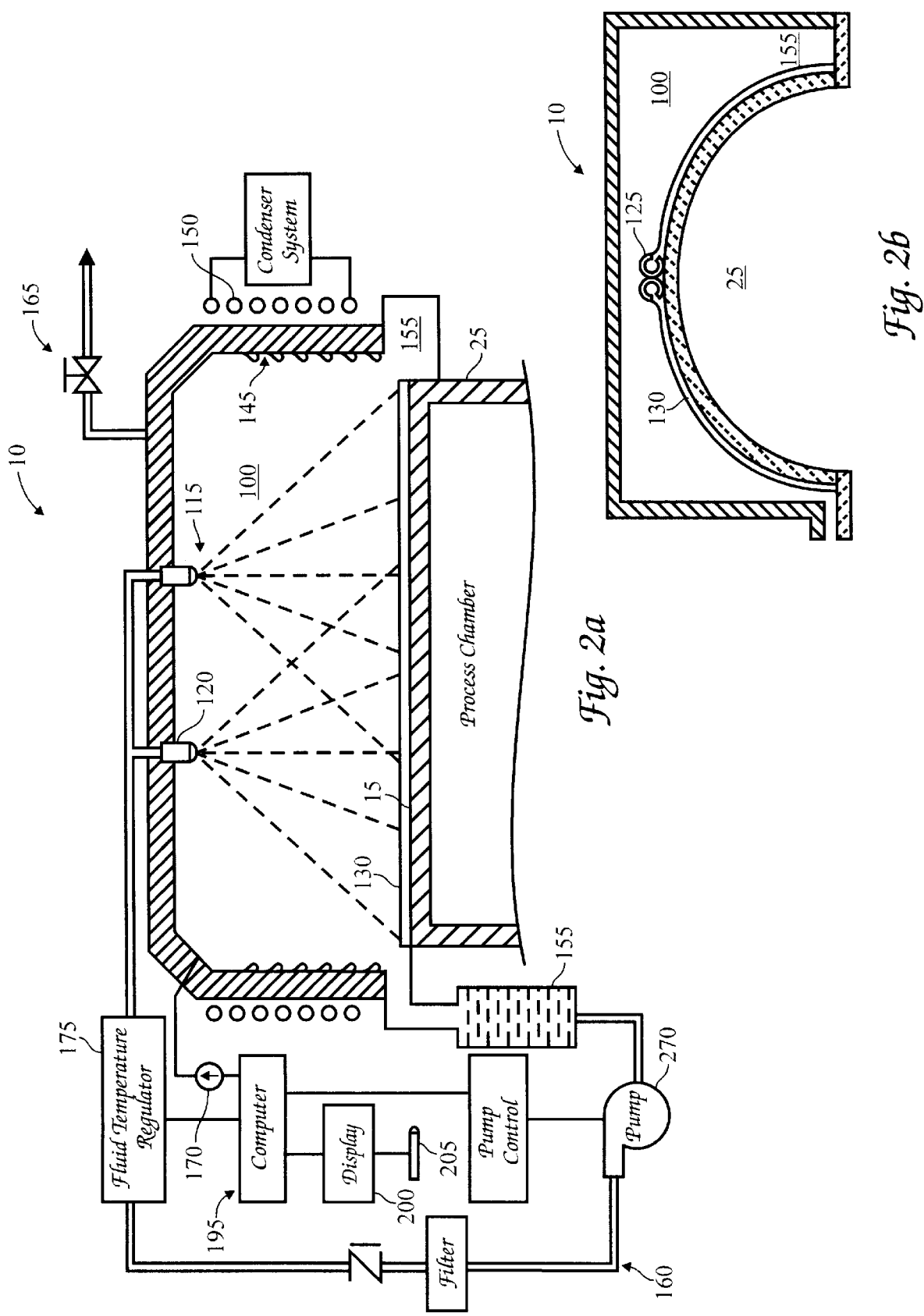
FIG. 2a is a schematic sectional side view of an embodiment of the temperature control system having a vapor chamber adjoining a process chamber surface and a fluid distributor comprising sprayer nozzles for spraying fluid onto the chamber surface.
FIG. 2b is a schematic sectional side view of an alternative embodiment of the temperature control system in which the fluid distributor comprises slit nozzles for releasing a stream of fluid onto the chamber surface.
Figure 3:
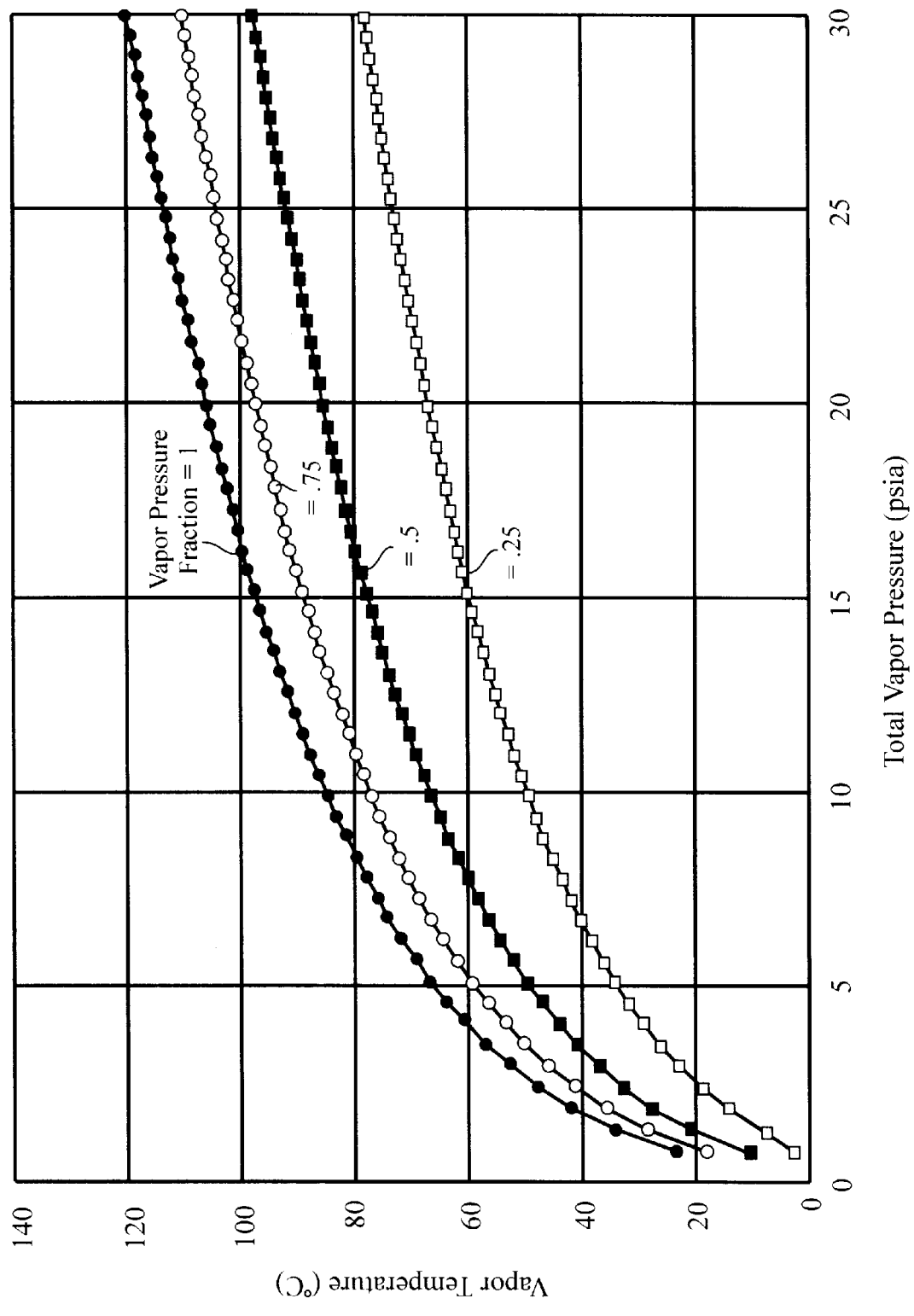
FIG. 3 is a graph showing increasing vaporization temperature for increasing total pressure for increasing partial pressure fractions of vapor in the vapor chamber.

A fluid distributor 115 in the vapor chamber 100 applies fluid to the chamber surface 15 to control the temperature of the chamber surface. Preferably, the fluid distributor 115 comprises one or more nozzles arranged to apply a continuous film 130 over at least a portion of the chamber surface. The fluid covers substantially the entire chamber surface 15 in the vapor chamber uniformly and continuously to prevent formation of localized hot spots that would otherwise arise at areas where the entire fluid film 130 has vaporized due to a higher localized heat load. More preferably, the fluid distributor applies the fluid film 130 sufficiently thin to reduce any temperature differences that occur through the thickness of the fluid film 130. The nozzles of the fluid distributor are preferably sprayer nozzles 120 that spray fluid on the chamber surface 15, as shown in FIGS. 1 and 2a, or slit nozzles 125 that release thin streams of fluid over the chamber surface, as shown in FIG. 2b, to form a fluid film 130 on the surface. As the fluid film 130 on the chamber surface vaporizes, i.e., changes in phase from a liquid phase to a vapor phase, it removes a predictable quantum of heat that is proportional to the specific heat of vaporization of the fluid. As the heat load in the process chamber 25 increases, the added heat is removed by increased vaporization from the fluid film 130 without change in the temperature of the chamber surface 15. To maintain the fluid film 130 on the chamber surface 15, the fluid distributor 115 disperses fluid at a rate that is greater than the rate of vaporization from the fluid film 130. Furthermore, as shown in FIG. 3, the vaporization temperature of the fluid, and consequently the temperature of the chamber surface 15, can be controlled by adjusting either the total pressure in the vapor chamber 100, or the partial pressure of the vapor relative to the total pressure. FIG. 3 shows the vaporization temperature of an exemplary fluid increasing as a function of total pressure for various fractions vapor partial pressure of in the vapor chamber.

Preferably, the fluid film 130 comprises a fluid dielectric material having a thickness and an electrical field absorption at radio frequencies that is sufficiently low to allow the RF induction field generated by the inductor antenna 85 adjacent to the chamber surface 15 to permeate or pass through the fluid film on the chamber surface with substantially no attenuation or loss of energy. Suitable low dielectric constant fluids, include perfluorinated liquids such as Galden®, commercially available from Ausimont U.S.A. Inc., New Jersey, or Fluorinert®, commercially available from the 3M Corporation, Minnesota.

More preferably, the fluid comprises a liquid having a low surface tension relative to the chamber surface 15, that spreads uniformly across the chamber surface 15. The fluid should also be non-reactive to both the chamber surface 15 and the other components of the temperature control system 10, and chemically stable over a wide temperature range. The fluid should also have a low specific heat capacity $C_p$ to provide higher sensitivity to temperature fluctuations of the chamber surface 15. When the fluid has a low $C_p$, even a small change in the temperature of the chamber surface 15 will immediately cause increase vaporization of the fluid, thereby lowering the temperature of the chamber surface 15. Preferably, the fluid has a specific heat capacity $C_p$ of less than about 0.5 cal/g, and more preferably less than about 0.25 cal/g.

In the embodiment shown in FIGS. 1 and 2a, the fluid distributor 115 comprise sprayer nozzles 120 positioned above the chamber surface 15 to spray fluid onto the chamber surface to form the fluid film 130. The sprayer nozzles 120 are spaced apart and oriented to cover substantially the entire chamber surface 15 in the vapor chamber with a fluid spray that forms a continuous fluid film 130 having a uniform thickness, even on complex shaped or convoluted surfaces. By continuous fluid film is meant a fluid film that is not excessively patchy or that covers only selected sections of the chamber surface 15. Also, as shown in FIG. 1, the process chamber 25 can comprise a multi-radius dome-shaped ceiling 45 having a slope sufficiently steep to cause the sprayed fluid to form a fluid film 130 having a uniform thickness across substantially the entire chamber surface 15. This is because the fluid applied to the top of the chamber surface 15 flows radially outward and downward under gravity. To reduce the height of the vapor chamber 100 each sprayer nozzle 120 provides a cone of fine mist with wide radial coverage at a small height above the chamber surface 15. In a preferred version, the sprayer nozzles 120 spray a cone-shaped fog of atomized fluid at an angle of from about 150° to about 45°, and at an elevation of less than about 30 cm above the chamber surface 15. In an even more preferred embodiment, the fluid distributor 115 comprises sprayer nozzles 120 that have few moving parts and are easier to maintain.

Alternatively, as shown in FIG. 2b, the fluid distributor 115 can comprise one or more slit nozzles 125 that apply a thin stream of fluid onto the chamber surface 15. Preferably, the slit nozzles 125 are shaped to provide a thin stream of fluid across substantially the entire chamber surface 15. For example, when the chamber surface 15 is dome-shaped, the slit nozzles 125 can comprise a tubular ring 135 positioned at the apex of the dome and having a slit 140 extending across a centerline of an outer perimeter of the tube to disperse a stream of fluid that extends 360° around the top of the dome. The stream of fluid flows downward to cover the entire chamber surface 15 with a thin uniform film of fluid.

The vapor formed in the vapor chamber 100 by the vaporization of the fluid film 130 on the chamber surface 15 is condensed on a inner surface of the inner wall 105 of the vapor chamber, releasing heat removed from the chamber surface at a distal location. Preferably, the vapor chamber 100 comprises a condenser 145 having coolant channels 150 holding conventional condenser coolant for cooling and condensing the vaporized fluid to form condensate. The condenser coolant is filtered and maintained at a neutral pH to reduce erosion or corrosion in the coolant channels 150. More preferably, the coolant channels 150 are recessed in the inner wall 105 of the vapor chamber 100 to reduce the thickness of material between the coolant channels and the inner surface of the inner wall to provide higher heat transfer rates. The vapor chamber 100 further comprises a reservoir 155 for collecting the condensate to supply fluid to a recirculating system 160 that filters and pumps the fluid from the reservoir 155 to the fluid distributor 115.

Figure 4:
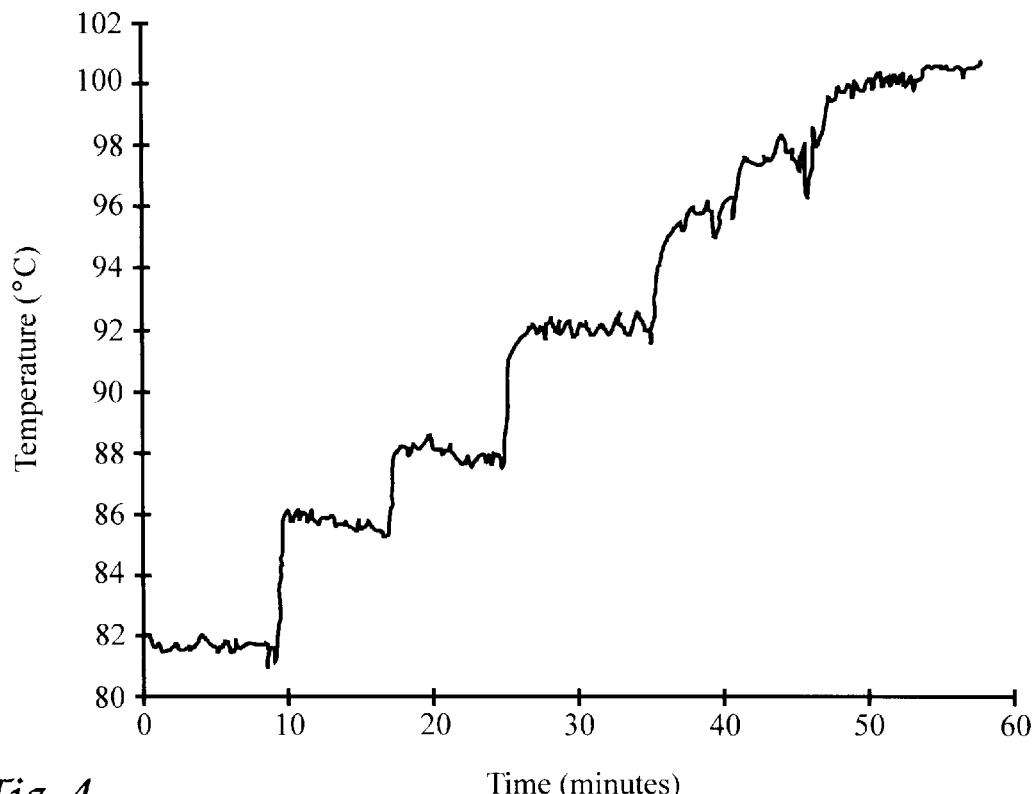
FIG. 4 is a graph showing the increasing chamber surface temperature for increasing vapor partial pressure in the vapor chamber adjoining the process chamber.

In operation, a plasma formed in the process chamber 25 heats the chamber surface 15 and causes a portion of the fluid film 130 to vaporize to form vapor in the vapor chamber 100. An optional vent valve 165 in the vapor chamber 100 can be opened to release the air or other gas in the vapor chamber, to adjust the partial pressure of vapor in the vapor chamber and thereby change the vaporization temperature of the fluid on the chamber surface 15. Thus a desired equilibrium temperature of the chamber surface 15 is set by varying the total pressure of vapor or the ratio of vapor to air in the vapor chamber 100. This is accomplished by opening the vent valve 165 while fluid is being sprayed into the vapor chamber 100 to vent to the atmosphere a fraction of the air or gas in the vapor chamber 100. Generally, as the ratio of the partial pressure of the vapor to air in the vapor chamber 100 increases the vaporization temperature of the fluid film 130 also increases proportionateley. FIG. 4 shows the increase in the vaporization temperature, measured as a corresponding increase in chamber surface temperature, caused by increasing the ratio of the partial pressure of the vapor to air in the vapor chamber 100. In deriving data for FIG. 4, the vent valve was opened briefly at 9 minute intervals from 9 minutes to 45 minutes to raise the partial pressure of the vapor in the vapor chamber. Thus, opening the vent valve 165 increases the partial pressure of vaporized fluid in the vapor chamber 100, and the vaporization temperature of the fluid film 130. Conversely, not opening the vent valve 165 allows the partial pressure of vaporized fluid in the vapor chamber 100, and consequently the vaporization temperature of the fluid film 130, to stabilize at a lower equilibrium value. Therefore, the equilibrium temperature of the chamber surface 15 can be adjusted by varying the duration and aperture of the vent valve 165. The vent valve 165 can be any type of valve that can be manually or remotely actuated by mechanical, electronic, or pneumatic means. For example, a suitable remotely actuated vent valve 165 comprises a motor-operated globe valve that has multiple different apertures that provide varying flow rates.

In an alternative embodiment, the vapor pressure of the vapor in the vapor chamber 100 can be adjusted by introducing a premixed ratio of fluid and gas into the vapor chamber (not shown). The gas is preferably a non-reactive gas such as $N_2$ or Ar. A computer program (as described below) is used to control the volumetric fraction of vapor to gas to achieve the desired vaporization temperature of the fluid/gas mixture applied to the chamber surface 15.

A pressure sensor 170, such as for example manometer, that measures the pressure in the vapor chamber 100. The pressure sensor 170 and a temperature regulator 175 that heats or cools the fluid as necessary to maintain a predetermined vapor chamber 100 pressure cooperate to provide a closed loop temperature control system 10. Preferably, the temperature regulator 175 comprises an in-line heater 180 that heats the fluid while it is in the recirculating system 160 to a temperature close to its vaporization temperature. The heated fluid provides more sensitive control of the temperature of the chamber surface 15 and a more rapid response to its temperature fluctuations because only a small quantum of heat is needed to vaporize the fluid film 130 that is already close to its vaporization point. The pressure of the vapor continues to increase as the fluid film 130 on the chamber surface 15 continues to vaporize. The pressure sensor 170 senses the increased pressure in the vapor chamber 100 and proportionately lowers the operating temperature of the heater of the temperature regulator 175. Eventually, an equilibrium condition is reached at which the absolute pressure in the vapor chamber 100 is equal to a predetermined set-point pressure. The two-phase environment in the vapor chamber 100 now operates a self-regulating temperature controller. As the heat load in the process chamber increases, more fluid vaporizes to increase the vapor pressure in the vapor chamber 100. The increased vapor pressure is sensed by the pressure sensor 170 and the operating temperature of the temperature regulator 175 is lowered to provide a cooler fluid that is sprayed through the fluid distributor 115 to cool or remove more heat from the chamber surface 15.

Figure 5A:
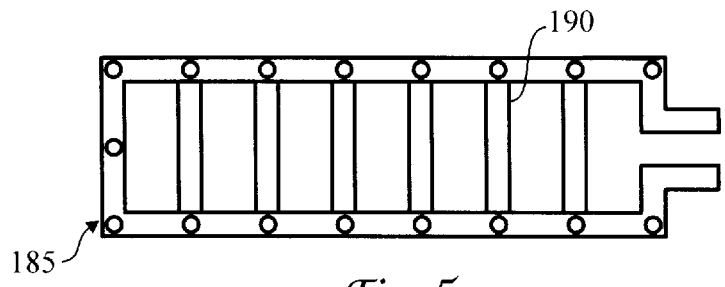
FIG. 5a is a schematic sectional side view of a flat heater for heating fluid prior to application of the fluid by the fluid distributor.
Figure 5B:
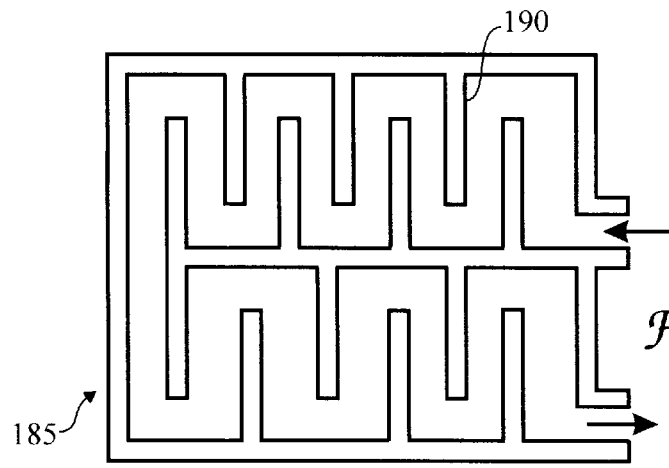

In an even more preferred embodiment, the temperature regulator 175 comprises a flat heater 185, shown in FIGS. 5a and 5b. The flat heater 185 is preferred because it comprises an internal grid 190 having a large heated surface area that heats the fluid at a low heat rate as the fluid flows past the grid surfaces. Also, because flat heater 185 conforms to many surfaces of the processing apparatus 20 and temperature control system 10, it can be mounted to reduce the overall footprint of the apparatus. Also, typically, the fluid can tolerate heaters that apply only up to about 20 W/in$^2$ at flow rates used in the present invention, and more rapid heating causes the low RF absorption properties of the fluid to deteriorate. The large surface area of the internal grid 190 allows the flat heater 185 to apply a total of over 4000 watts to heat the fluid at a rate of less than about 20 W/in$^2$.

The apparatus 20 and temperature control system 10 of the present invention are operated by a computer program that runs on a computer system 195 comprising a central processor unit (CPU) interconnected to a memory system with peripheral control components, such as for example, a PENTIUM microprocessor, commercially available from Intel Corporation, Santa Clara, Calif. The program code can be written in any conventional computer readable programming language, such as for example, assembly language, C, C$^{++}$, or Pascal. Suitable program code is entered into a single file, or multiple files, using a conventional text editor and stored or embodied in a computer-usable medium, such as a memory system of the computer. If the entered code text is in a high level language, the code is compiled to a compiler code which is linked with an object code of precompiled windows library routines. To execute the linked and compiled object code, the system user invokes the object code, causing the computer system 195 to load the code in memory to perform the tasks identified in the computer program.

The interface between an operator and the computer system 195 is a CRT monitor 200 and a light pen 205, as shown in FIG. 1. The light pen 205 detects light emitted by the CRT monitor 200 with a light sensor in the tip of the pen. To select a particular screen or function, the operator touches a designated area of the CRT monitor 200 and pushes a button on the pen. The area touched changes its color or a new menu or screen is displayed to confirm communication between the light pen 205 and the CRT monitor 200. Other devices, such as a keyboard, mouse or pointing communication device, can also be used to communicate with the computer system 195.

Figure 6:
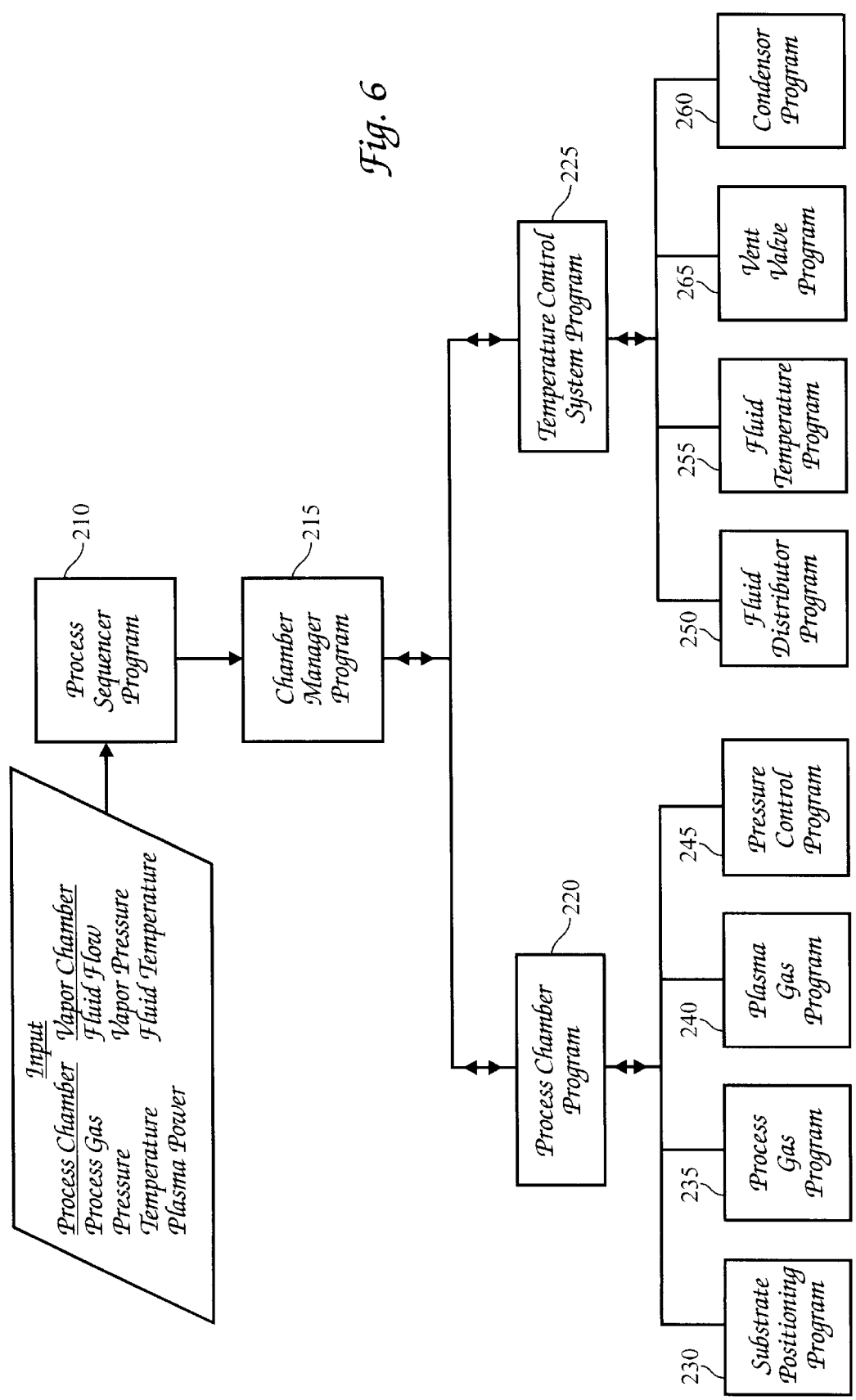
FIG. 6 is an illustrative block diagram of a computer program suitable for operating the temperature control system.

As illustrated in FIG. 6, the computer program typically comprises multiple programs of program code including a process sequencer program 210 for sequencing and timing operations in the apparatus 20, a chamber manager program 215 for managing priorities of components in the apparatus, a process chamber program 220 for operating the process chamber, and a temperature control program 225 for operating the temperature control system 10. While described as separate programs performing a set of tasks, it should be understood that each of these programs can be integrated with one another, or the tasks of one program integrated with the tasks of another program to perform the desired set of operations. Thus the computer program described herein should not be limited to the specific embodiment of the functional programs described herein; and any other set of programs or merged program code that performs equivalent sets of functions are within the scope of the present invention.

The process sequencer program 210 comprises program code that allows an operator to select, define, and/or enter process parameters for operation of the entire processing apparatus 20. For example, typical process parameters needed to operate the process chamber 25 include process gas composition and flow rates, temperature, pressure, plasma set-point conditions such as RF bias power levels and magnetic field power levels, cooling gas pressure, and process chamber wall temperature. When scheduling which set of process conditions is to be executed, the process sequencer program 210 compares the present condition of the process chamber 25 to the desired process conditions, or the "age" of each particular user entered request, or any other relevant factor used to determine scheduling priorities. Before operation of the process chamber 25, the process sequencer program 210 passes the process parameter information to the chamber manager program 215.

The chamber manager program 215 comprises program code for accepting the process parameters from the process sequencer program 210, and coordinating timing and providing other instructions to the process chamber program 220 that operates the process chamber 25, or instructions to a temperature control program 225 that operate the temperature control system 10. For example, the chamber manager program 215 comprises program code for controlling the timing of etch, CVD, or PVD processes performed in the process chamber 25, as well as timing operations for the cooling or heating of the vapor chamber 100. The chamber manager program 215 also controls execution of various chamber component programs for performing a process set. Preferably, the chamber manager program 215 includes program code for (i) monitoring the operation and output of the process chamber 25 and the temperature control system 10 in the vapor chamber 100, (ii) determining if the power level or operation cycle of any component is to be changed, and (iii) providing timing instructions to the different process chamber components. Conventional methods of monitoring the components and sensors, such as polling, are used.

Once the chamber manager program 215 has accepted the process set combination from the process sequencer program 210 and determined the availability of the process chamber 25, the chamber manager program 215 passes program code identifying the process set and parameters to the process chamber program 220 and the temperature control program 225. The process chamber program 220 includes sets of program code for controlling the components in the process chamber 25. Examples of program code sets include a substrate positioning program 230, a process gas control program 235, a plasma control program 240, and a pressure control program 245. The substrate positioning program 230 controls operation of one or more robots (not shown) that transport the substrates 30 in and out of the process chamber 25. The process gas control program 235 controls the process gas composition and flow rates of process gas into the process chamber 25 by monitoring and controlling the settings of the gas flow controllers 65. The plasma control program 240 comprises program code for forming a plasma in the process chamber 25 by setting the levels of the RF current to the inductor antenna 85, and the RF bias voltage applied to the process electrodes in the process chamber. The plasma control program 240 also includes steps for monitoring "forward" power produced by the plasma generator and "reflected" power reflected from the process chamber, and adjusting the output impedance of the plasma generator as necessary to minimize reflected power. The pressure control program 245 controls the opening size of the throttle valve 80 of the exhaust system 70 for controlling the pressure in the process chamber 25.

The temperature control program 225 comprises program code for monitoring various vapor chamber components, determining which component needs to be operated based on the process parameters passed by the chamber manager program 215, and operating the components in response to the monitoring and determining steps. The temperature control program 225 includes a fluid distributor program 250, a fluid temperature program 255, a condenser program 260, and optionally a vent valve program 265. The fluid distributor program 250 comprises program code for controlling the flow rate of fluid through the fluid distributor 115. The fluid distributor program 250 can also operate and monitor other recirculating system 160 components such as a recirculation pump 270, or a fluid supply valve 275. The condenser program 250 comprises program code for monitoring the temperature and flow rate of condenser coolant through the coolant channels 150, and for adjusting the flow rate in response to a signal input from a temperature measurement device (not shown) in the condenser 145. The condenser program 250 can also comprise program code for operating a recirculator/chiller (not shown) for recirculating and chilling the condenser coolant. When the optional vent valve program 255 is invoked, the vapor chamber 100 pressure as measured by the pressure sensor 170 is compared to a target pressure, and the vent valve 165 is opened a calculated amount for a calculated period of time to obtain the desired partial pressure of vapor in the vapor chamber. In operation, the temperature control program 225 accepts a signal from the pressure sensor 170, and performs proportional, integration, and differential calculations to determine changes in temperature control system parameters, such as fluid temperature or vapor chamber pressure, which are necessary to achieve or restore the desired chamber surface temperature.

Alternatively, a separate discrete PID controller 280 can be used in place of the temperature control program 225. A suitable PID controller 280 comprises a single purpose controller having program code for monitoring temperature, controlling power supplied to the temperature regulator 175, and calculating a parameter, such as vapor chamber pressure, from a dynamic model. The PID controller 280 can also be programmed to directly monitor process parameters such as the pressure of the vapor chamber 100 or the temperature of the chamber surface 15. In a preferred arrangement, the temperature control system 10 comprises a simplified control loop in which the PID controller 280 monitors the pressure in the vapor chamber 100 directly, as opposed to through the temperature control program 225, and activates a relay applying power to the in-line heater 180 after comparing the measured pressure to the desired set-point pressure.

Figure 7:
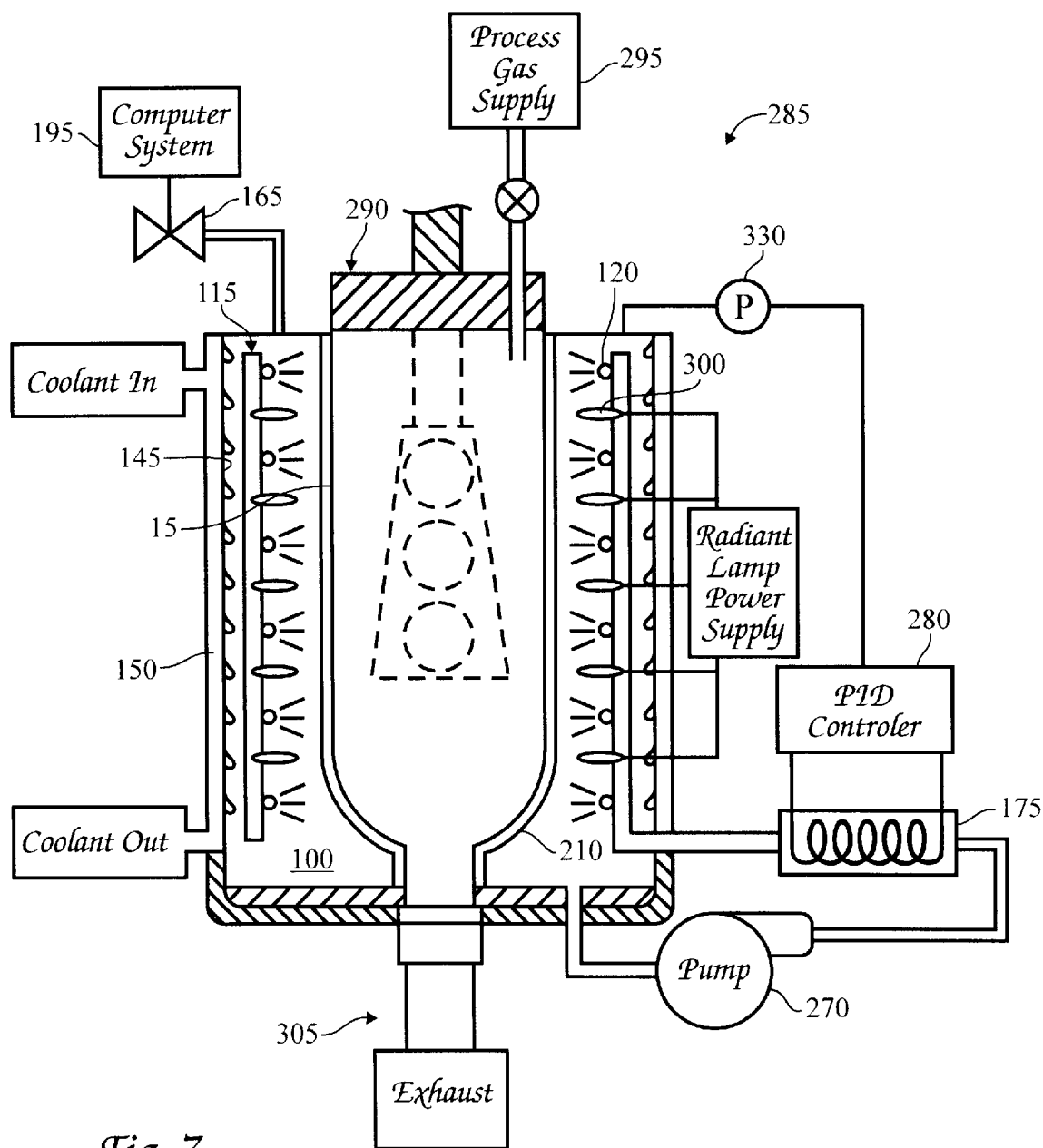
FIG. 7 is a schematic sectional side view of an epitaxial deposition chamber comprising a temperature control system according to the present invention.

The temperature control system 10 described herein can be adapted to any semiconductor process chamber 25. For example, a CVD chamber which is used to deposit layers of conducting or dielectric material by chemical vapor deposition, as for example described in U.S. Pat. No. 5,500,249, which is incorporated herein by reference. FIG. 7 illustrates a temperature control system 10 according to the present invention adapted to control the temperature of an epitaxial CVD reactor 285. The epitaxial CVD reactor 285 deposits from reactant gases, a thin single crystal layer of semiconducting material on the substrate 30, as for example described in U.S. Pat. No. 5,160,545, which is incorporated herein by reference. Generally, the epitaxial CVD reactor 285 comprises a deposition chamber 290, a process gas supply 295 for the introduction of process gas into the chamber, a substrate heating source 300, and an exhaust system 305 to remove effluent gases. The epitaxial process is highly temperature-sensitive because the crystalline structure deposited on the substrate 30 is dependent on the temperature of the substrate. Thus it is desirable to maintain the deposition chamber 290, and thereby the substrates 30, at a constant temperature. When the substrate heating source 300 comprises heat lamps shining through a deposition chamber 290 that is transparent to thermal radiation, it is also desirable to maintain the walls of the deposition chamber at a temperature below that at which deposition occurs to avoid deposits on the walls that would block the light from the heat lamps. In this embodiment, a jacket surrounding and enclosing the deposition chamber 290 defines the vapor chamber 100. The fluid distributor 115 comprises a plurality of conduits in the vapor chamber 100, the conduits oriented substantially parallel to the vertical axis of the deposition chamber 290 and extending substantially the entire length of the vapor camber. The fluid distributor 115 further comprises a plurality of nozzle sprayers 120 attached to a conduit and arranged to spray fluid uniformly over the surface of the deposition chamber 290 to form a fluid film 130. A condenser 145 comprising channels within the inner wall 105 of the vapor chamber 100, condenses the fluid vaporized from the fluid film 130 to form condensate. The condensate is collected in the lower portion of the vapor chamber 100, and pumped through a filter and a temperature regulator 175, and returned to the fluid distributor 115. The PID controller 280 or the temperature control program 225 receives a signal from the pressure sensor 170 and adjusts power to the temperature regulator 175 to heat the fluid as necessary to control the vapor chamber pressure and thus deposition chamber 285 temperature.

Figure 8:
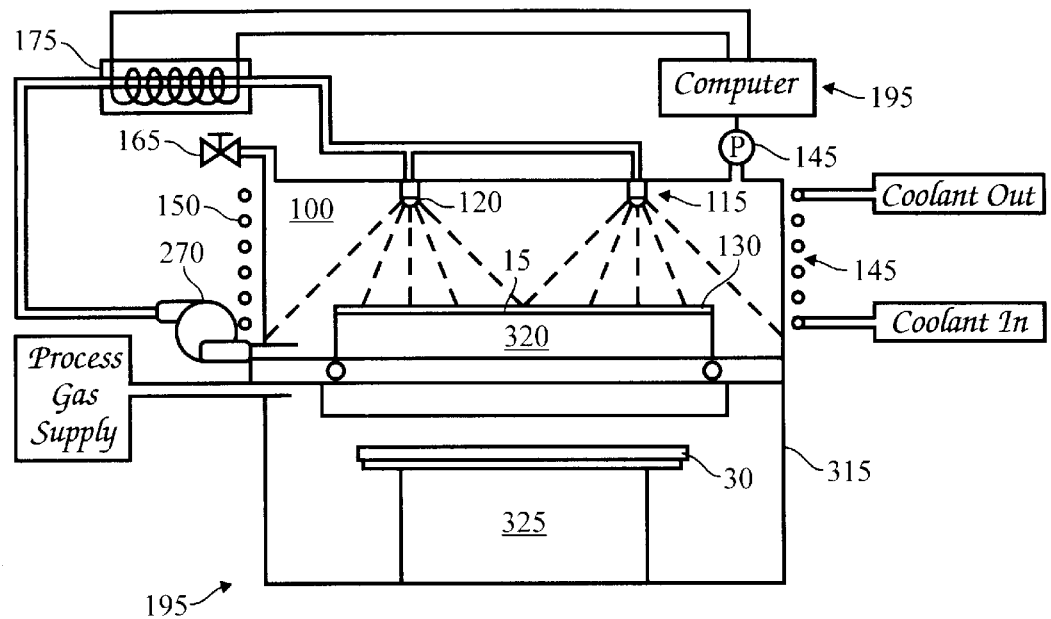
FIG. 8 is a schematic sectional side view of a sputtering chamber comprising a temperature control system according to the present invention.

FIG. 8 shows a sputtering apparatus 310 comprising a physical vapor deposition chamber 315 having a temperature control system 10 to control the temperature of its surface. In the sputtering apparatus 310, sputtered thin films are deposited on the substrate 30 from sputtered atoms of material vaporized from the surface of a target 320 by high energy ions in a DC glow-discharge or RF plasma as for example described in U.S. Pat. No. 5,108,570, which is incorporated herein by reference. In a typical sputtering apparatus 310, the substrate 30 is placed on a support 325 directly below the target 320 which is bombarded by high energy plasma ions. Atoms of material sputtered from the target 320 condense on the substrate surface forming a thin film of sputter material. The kinetic energy of the plasma ions which remove material from the target 320 is absorbed by target as heat effecting the rate at which material is removed from the target. To improve process stability it is desirable to have a temperature control system 10 capable of removing excess heat accumulated in the target 320, to provide uniform and steady state temperatures across the target. In this embodiment, the vapor chamber 100 is defined by an enclosure surrounding a back surface of the target 320. The fluid distributor 115 comprises a plurality of nozzle sprayers 120 arranged to spray fluid uniformly over the back surface of the target 320 to form a fluid film 130 on the surface. Vaporized fluid is condensed by the condenser 145 comprising channels 150 within the inner wall 105 of the vapor chamber 100, collected in a lower portion of the vapor chamber. From there it is pumped through a temperature regulator 175, and back to the fluid distributor 115. The power to the temperature regulator 175 is controlled by a PID controller 280 or a computer program to control the vapor chamber pressure and thus the vaporization temperature of the fluid film 130 and the temperature of the target 320.

Figure 9:
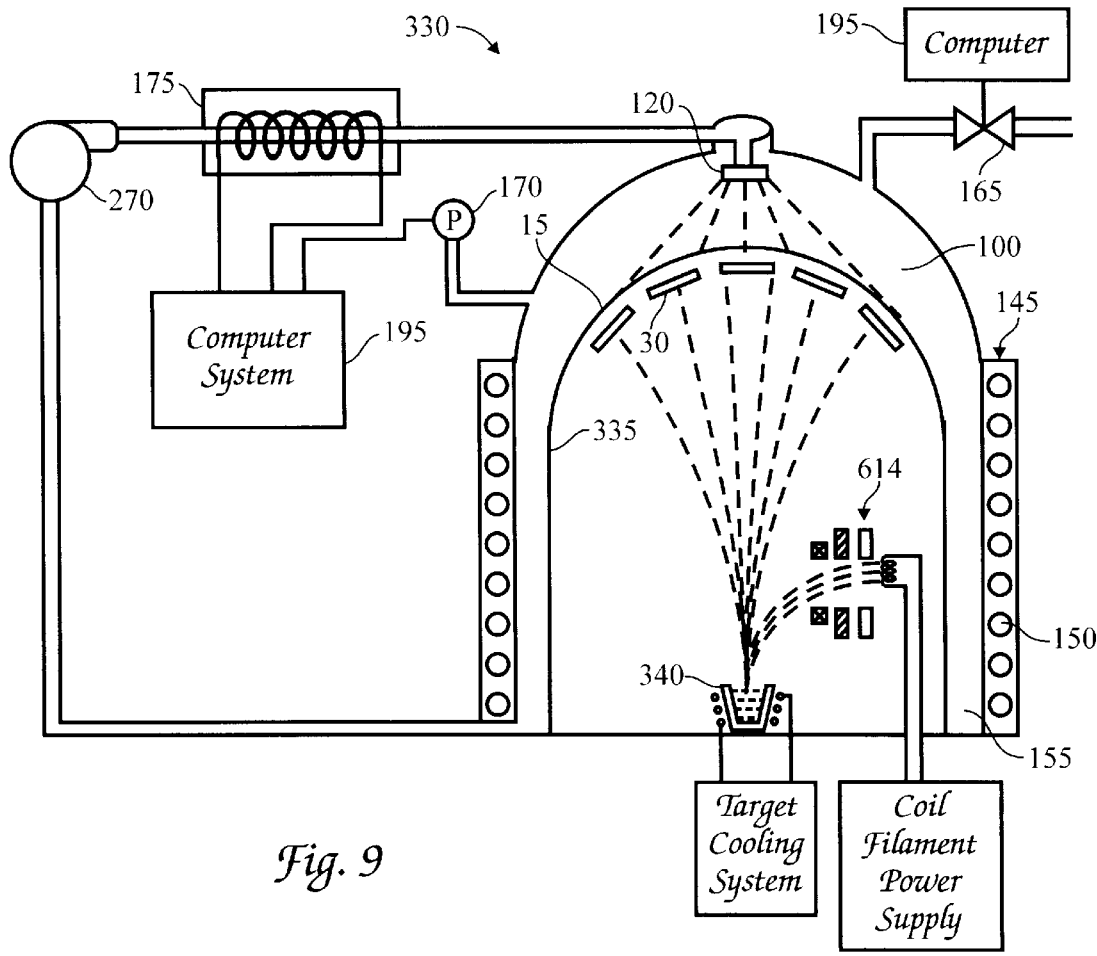
FIG. 9 is a schematic sectional side view of an electron beam evaporator chamber comprising a temperature control system according to the present invention.

FIG. 9 illustrates an electron-beam evaporator 330 comprising a chamber 335 having a hearth 340 filled with a target material, for example aluminum or copper, which is vaporized by a stream of high energy electrons generated by an electron-beam gun 345. The vaporized target material condenses on the surface of the substrates 30 positioned around and above the hearth 340 and on an inner surface of the chamber 335 to deposit a thin layer of the target material. The chamber 335 is held at constant temperature to provide a stable evaporation process. Also, because the material deposited on the inner surface of the chamber 335 can flake off and contaminate the substrates 30 when subjected to thermal stresses, the temperature across the chamber surfaces should be kept uniform and constant. A bell shaped jacket surrounding and enclosing the chamber 335 defines the vapor chamber 100. The fluid distributor 115 comprises one or more sprayer nozzles 120 attached to the top of the vapor chamber 100 to spray fluid uniformly over the chamber 335 to form a continuous fluid film 130. Channels 150 within the inner wall 105 of the vapor chamber 100 serve as a condenser 145 to condense fluid vaporized from the fluid film 130 to form condensate. The condensate is collected in a lower portion of the vapor chamber 100, and from there it is pumped through a temperature regulator 175, and returned to the fluid distributor 115. A PID controller 280 receives a signal from the pressure sensor 170 and adjusts power to the temperature regulator 175 to heat the fluid as necessary to control the vapor chamber pressure and thus the temperature of the chamber 335.

EXAMPLES

Examples 1–4 demonstrate that the temperature control system 10 of the present invention is a self-regulating system that is capable of rapidly stabilizing temperature fluctuations in a semiconductor processing apparatus 20 having a large heat load and maintaining excellent temperature stability and uniformity across the surfaces of the process chamber 25. In these experiments, a radiant heat lamp was placed in a process chamber 25 to simulate the heat load from a process plasma. The temperature profile across the chamber was measured for different heat loads from the heat lamp, various "open" settings for the vent valve 165, and different heat settings for the temperature regulator 175 that controls the fluid temperature.

Example 1

Example I demonstrates the temperature stability provided by the temperature control system 10 for widely varying heat loads generated by the heat lamp in the process chamber 25. In this experiment, the absolute pressure in the vapor chamber 100 was set at 53.8 kPa (7.8 psi). The flow rate of fluid to the fluid distributor 115 was maintained at 3.03 liters/min (0.8 gpm), and the flow rate of condenser coolant in the condenser 145 held at 0.988 liters/min (0.25 gpm). The power applied to the radiant heat lamps was increased in steps from 0 Watts to 3000 Watts. The temperature of the chamber surface 15, the power applied to the heater 180 of the temperature regulator 175, and the power removed by the condenser 145 were monitored and recorded, as shown in Table I. The temperature of the chamber surface 15 did not vary more than ±2° C. from the desired operating temperature of 85° C., Even for a large change in heat load of 3000 Watts. Also, as the simulated heat load was increased by increasing power applied by the heat lamps inside the process chamber 25, the temperature control system 10 automatically decreased power applied to the temperature regulator 175.

TABLE I

| HEAT LOAD (WATTS) | TEMPERATURE REGULATOR (WATTS) | HEAT REMOVED (WATTS) | SURFACE TEMPERATURE (° C.) |
| --- | --- | --- | --- |
| 0 | 1645 | 1388 | 85 ± 2 |
| 1000 | 1400 | 1388 | 85 ± 2 |
| 1500 | 1225 | 1388 | 85 ± 2 |
| 2000 | 1120 | 1425 | 85 ± 2 |
| 2500 | 1015 | 1425 | 85 ± 2 |
| 3000 | 700 | 1461 | 85 ± 2 |

Figure 10:
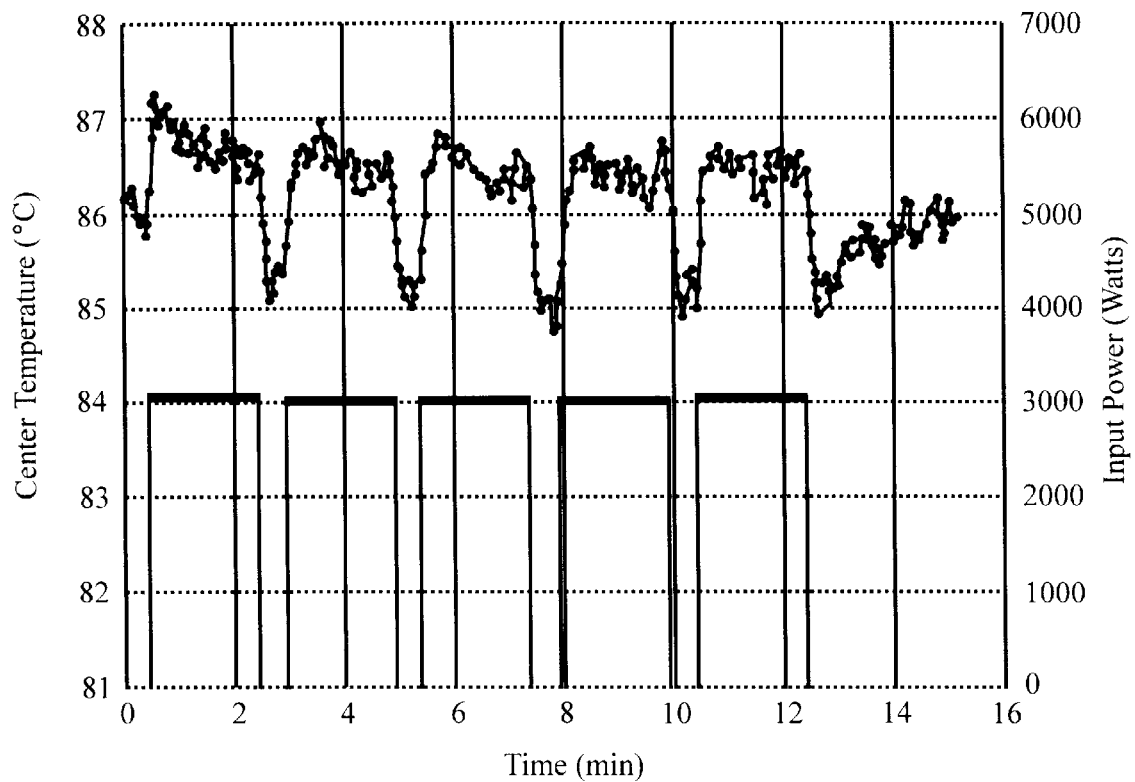
FIG. 10 is a graph showing the temperature changes of a chamber surface operated by the temperature control system as a heat load inside the chamber is turned on and off.

The experimental results summarized in Table I are further validated by the graph of FIG. 10 which shows the measured temperature of the chamber surface 15 as a function of time, while the simulated heat load of the radiant lamp is cycled on and off. FIG. 10 demonstrates that for a heat load on the chamber surface 15 that varies from 0 watts to 3000 Watts, the chamber surface temperature remains nearly constant not varying more than ±1° C. from the temperature set-point of 86° C. Thus it is seen the temperature control system 10 provides a significant improvement over conventional air cooled systems that often result in temperature of 5 to 20° C. variations for widely varying heat loads in the chamber.

Example 2

While the temperature control system 10 provides excellent sensitivity to fluctuations in the temperature of the chamber surface 15, the temperature stability of the temperature control system 10 is not highly dependent on the flow rate of condenser coolant through the condenser 145. As shown in Table II, the power to the heat lamps in the process chamber 30 was maintained at 2000 Watts, the flow rate of fluid was 2.27 liters/min (0.6 gpm), and the pressure in the vapor chamber 100 at 62 k Pa (9 psi). When the flow rate of condenser coolant in the condenser 145 was increased from 0.57 liters/min to 1.74 liters/min, the vapor in the vapor chamber 100 began condensing at a faster rate, to a lower pressure in the vapor chamber 100. The temperature control system 10 responded to the drop in vapor chamber pressure, by increasing the power to the heater 180 of the temperature regulator 175, thereby providing fluid at a higher temperature to the fluid distributor 115. The hotter fluid restored and maintained the chamber temperature of the chamber surface 15 at a constant level within ±2° C. from an operating temperature of 90° C.

TABLE II

| COOLING FLOW LITERS/MIN (gpm) | TEMPERATURE REGULATOR (WATTS) | HEAT REMOVED (WATTS) | SURFACE TEMPERATURE (° C.) |
| --- | --- | --- | --- |
| 0.57 (0.15) | 875 | 1249 | 90 ± 2 |
| 1.33 (0.35) | 1050 | 1688 | 90 ± 2 |
| 1.74 (0.46) | 1155 | 1680 | 90 ± 2 |

Example 3

Figure 11:
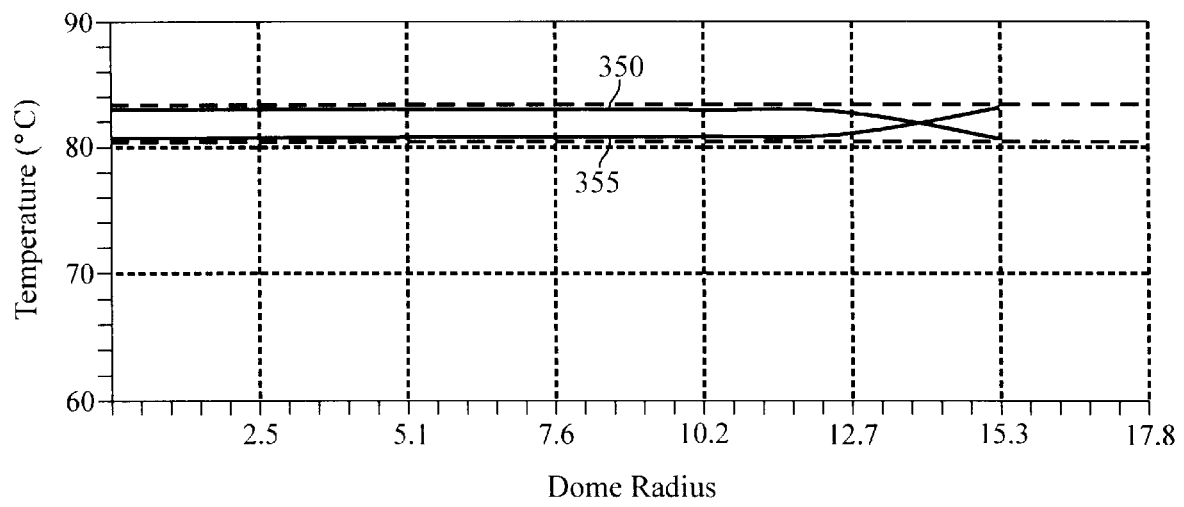
FIG. 11 is a graph showing a radial temperature distribution across the chamber surface for different fluid flow rates through the fluid distributor.

FIG. 11 illustrates the independence of chamber surface temperature from the flow rate of fluid through the fluid distributor 115. Line 350 shows chamber surface temperatures for a fluid flow of 3.03 liters/min (0.8 gpm), and line 355 shows chamber surface temperatures for a fluid flow of 2.27 liters/min (0.6 gpm). The temperature was measured at five points across the chamber surface 60 from the center to a peripheral edge using thermocouples. The total pressure in the vapor chamber 100 was set at 36.2 kPa (5.25 psi), the flow of coolant to the condenser 145 was 0.97 liters/minute (0.25 gpm), and a heat load was applied by a lamp operated at a power level of 3000 Watts. FIG. 11 also shows the uniformity of temperature across the chamber surface 15 from the center to a peripheral edge.

Example 4

Example 4 is a comparative experiment showing the significantly improved radial temperature distribution across a chamber surface 15 of a domed ceiling 45 for a forced-air cooling system as compared to a temperature control system 10 according to the present invention. The temperature across the chamber surface 15 was measured at five points from the center to the edge of the chamber, using platinum/platinum-rhodium thermocouples positioned at each point. The temperature gradient across the chamber surface 15 was plotted under conditions simulating chamber idle and chamber processing modes, for each of the two temperature control systems. The pressure in the vapor chamber 100 was set at 36.2 kPa (5.25 psi), the flow of coolant to the condenser 145 was held at 1.14 liters/min (0.3 gpm), and the flow of fluid to the fluid distributor 115 was held at 2.27 liters/min (0.6 gpm).

Figure 12:
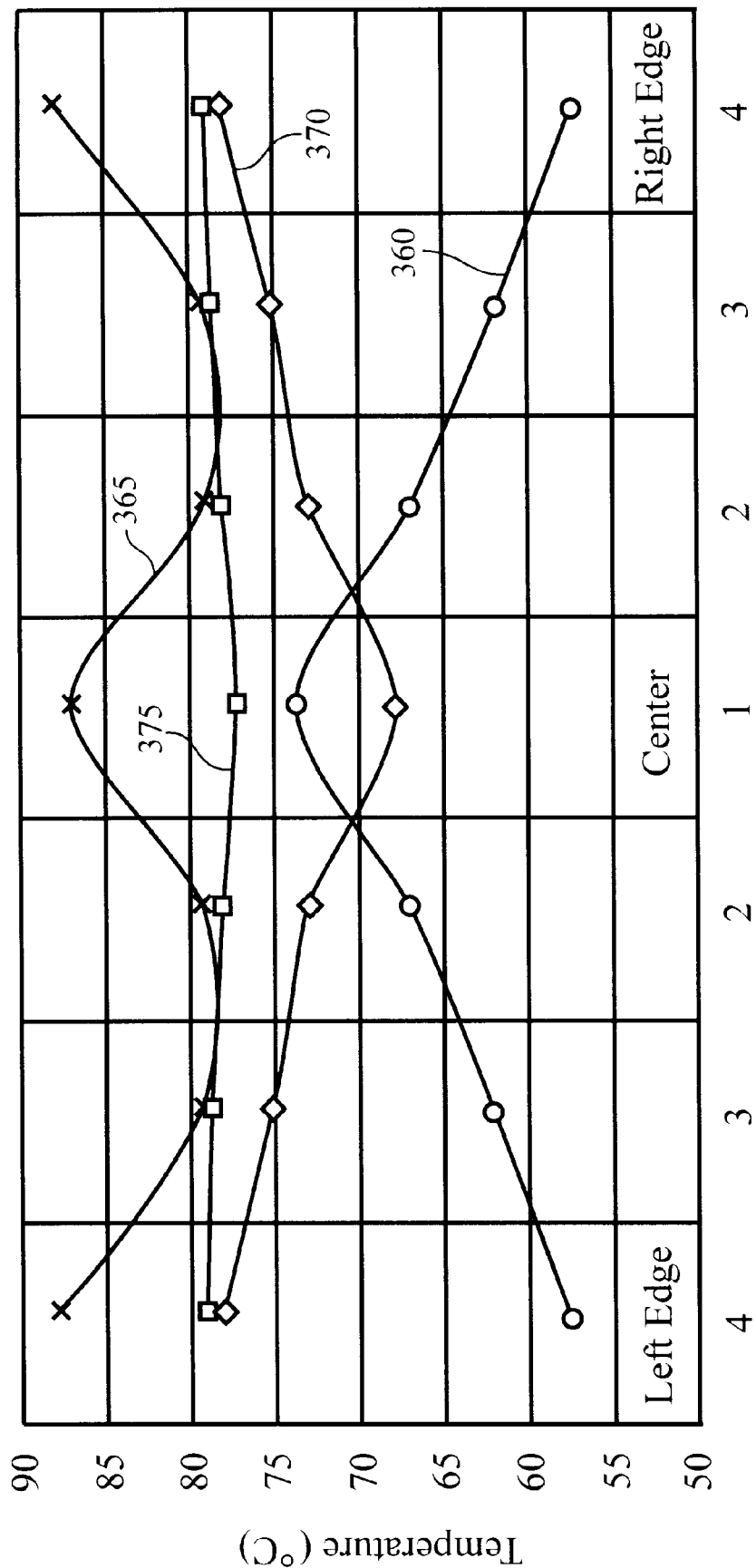
FIG. 12 is a graph comparing the temperatures distributions across a chamber surface that are provided by a temperature control system of present invention versus a forced-air cooling system.

FIG. 12 shows that the temperature gradient obtained across the chamber surface 15 with the temperature control system 10 of the present invention was more uniform, than the temperature gradient obtained with a forced-air cooling system. In FIG. 12, lines 360 and 365 represent the temperature gradient across the chamber surface 15 obtained by the forced-air cooling system operating in idle and processing modes, respectively; and lines 370 and 375 represent the temperature gradient across the chamber surface 15 obtained using the temperature control system 10 of the present invention in idle, and processing modes, respectively. In the chamber idle mode, the temperature gradient for the air-cooled system represented by line 360 is an inverted U-shaped curve that rises in temperature from either side to the center of the chamber surface 15, from 57 to 74° C. Thus the forced air cooling system provided a ΔT of about 17° C. In contrast, the temperature gradient of the present temperature control system 10, as shown by line 370, is a much smaller from 77 to 67° C., providing a ΔT of 10° C., which is about 100% less than the ΔT of the forced-air cooling system. In the chamber processing mode, the temperature gradient of the air-cooled system (line 365) is also an inverted U-shaped curve that includes two low temperatures of 78° C. and three high temperatures exceeding 87° C. In contrast, the temperature gradient from the present temperature control system 10, as shown in line 375, is almost negligible and changes less than 2° C. across the entire chamber surface 15, which is five times less than the difference in temperature obtained from the forced-air cooling system.

Although the present invention has been described in considerable detail with regard to the preferred versions thereof, other versions are possible. For example, the temperature control system 10 is suitable for controlling the temperatures of various surfaces of types of processing apparatus under varying thermal loads. Therefore, the appended claims should not be limited to the description of the preferred versions contained herein.

What is claimed is:

1. An apparatus capable of processing a substrate, the apparatus comprising:

(a) a process chamber having an external surface, the chamber comprising a support capable of holding the substrate in the chamber, a gas distributor capable of distributing process gas in the chamber, a plasma generator capable of forming a plasma from the process gas capable of processing the substrate, and an exhaust capable of exhausting spent process gas from the chamber; and (b) a vapor chamber surrounding the external surface of the process chamber, the vapor chamber comprising a fluid distributor adapted to apply a fluid film over the external surface of the process chamber to control the temperature of the external surface.

2. The apparatus of claim 1 wherein the fluid distributor comprises one or more nozzles capable of applying a substantially continuous fluid film over at least a portion of the external surface.

3. The apparatus of claim 1 further comprising:

(1) a pressure sensor capable of measuring a vapor pressure in the vapor chamber and generating a pressure signal; and (2) a temperature regulator capable of regulating the temperature of the fluid in relation to the pressure signal, prior to application of the fluid film on the external surface.

4. The apparatus of claim 1 wherein the vapor chamber further comprises a vent capable of venting vapor to adjust the vaporization temperature of the fluid applied on the external surface.

5. The apparatus of claim 1 wherein the vapor chamber further comprises:

(i) a condenser capable of condensing the vapor in the vapor chamber to form condensate at a location other than the external surface;

(ii) a reservoir capable of collecting the condensate; and (iii) a pump capable of pumping the condensate from the reservoir to the fluid distributor.

6. The apparatus of claim 1 wherein the external surface comprises a dielectric material.

7. The apparatus of claim 1 wherein the process chamber comprises one of an etching chamber, chemical vapor deposition chamber, physical vapor deposition chamber, or evaporator chamber.

8. The plasma processing apparatus capable of processing a substrate in a plasma, the apparatus comprising:

(a) a process chamber having an inductor antenna abutting a dielectric wall; and (b) a vapor chamber adapted to contain a vapor, the vapor chamber adjoining the dielectric wall, and the vapor chamber comprising a fluid distributor adapted to apply a fluid film on the dielectric wall.

9. The plasma processing apparatus of claim 1 wherein the dielectric wall comprises a ceiling.

10. The plasma processing apparatus of claim 8 wherein the fluid distributor comprises one or more nozzles capable of applying a substantially continuous fluid film over at least a portion of the dielectric wall.

11. The plasma processing apparatus of claim 8 further comprising:

(1) a pressure sensor capable of measuring a vapor pressure in the vapor chamber and generating a pressure signal; and (2) a temperature regulator capable of regulating the temperature of a fluid in relation to the pressure signal, prior to applying the fluid as the fluid film on the dielectric wall.

12. The plasma processing apparatus of claim 8 wherein the vapor chamber further comprises a vent capable of venting a vapor in the vapor chamber.

13. The plasma processing apparatus of claim 8 wherein the vapor chamber further comprises:

(i) a condenser capable of condensing the vapor in the vapor chamber to form condensate at a location other than the dielectric wall.

(ii) a reservoir capable of collecting the condensate; and (iii) a pump capable of pumping the condensate from the reservoir to the fluid distributor.

* * * * *